United States Patent [19]

Barclay et al.

[11] Patent Number: 4,516,248
[45] Date of Patent: May 7, 1985

[54] VARIABLE THRESHOLD RECEIVER

[75] Inventors: Thomas E. Barclay, Fort Washington, Md.; John A. Zett, Springfield, Va.

[73] Assignee: E-Systems, Inc., Dallas, Tex.

[21] Appl. No.: 459,896

[22] Filed: Jan. 21, 1983

[51] Int. Cl.³ ............................................. H03K 5/20
[52] U.S. Cl. ...................................... 375/76; 307/356
[58] Field of Search ................... 375/20, 17, 52, 106, 375/36, 76; 360/40; 370/85; 340/347 DD; 307/356-359

[56] References Cited

U.S. PATENT DOCUMENTS

| | | | |
|---|---|---|---|
| 2,999,925 | 9/1961 | Thomas | 375/76 |
| 3,681,698 | 8/1972 | McEvoy | 375/76 |
| 3,716,780 | 2/1973 | Van Elk et al. | 375/34 |
| 3,736,511 | 5/1973 | Gibson et al. | 375/76 |
| 3,766,479 | 10/1973 | Thalimer et al. | 375/88 |
| 3,991,379 | 11/1976 | Chadwick et al. | 307/358 |
| 4,027,335 | 5/1977 | Miller | 360/40 |
| 4,129,888 | 12/1978 | Reinholtz | 360/40 |
| 4,234,897 | 11/1980 | Miller | 375/52 |
| 4,241,312 | 12/1980 | Barnes et al. | 375/76 |
| 4,270,208 | 5/1981 | MacDavid | 375/76 |
| 4,280,221 | 7/1981 | Chun et al. | 375/17 |
| 4,287,596 | 9/1981 | Chari | 375/52 |
| 4,388,725 | 6/1983 | Saito et al. | 375/36 |
| 4,412,326 | 10/1983 | Limb | 370/85 |
| 4,426,591 | 1/1984 | Cargille | 307/359 |
| 4,427,901 | 1/1984 | Tomuro | 307/356 |

Primary Examiner—Robert L. Griffin
Assistant Examiner—Stephen Chin
Attorney, Agent, or Firm—Albert M. Crowder, Jr.

[57] ABSTRACT

A variable threshold receiver is disclosed which compensates for direct current (dc) voltages present in a received signal. The receiver utilizes an integrator-comparator circuit to recover data which may have been distorted by the presence of dc voltages. The integrator-comparator circuit provides data recovery by tracking the average of the peak signal levels of the received signal, eliminating the need for a lengthy preamble to compensate for receiver attack time.

5 Claims, 9 Drawing Figures

VARIABLE THRESHOLD RECEIVER

BACKGROUND OF THE INVENTION

The present invention relates to a method and apparatus for communicating data among a plurality of devices. More particularly, it relates to a high performance data communication peer network.

As digital computers became more widely utilized, there arose a demand for remote users to be able to communicate with a central computer in order to supply data to or receive data from the computer system. Typically, remote users operated at terminals or similar peripheral devices each of which were connected by a dedicated line to the central computer. The central computer controlled the communication with each of these remote users and served as the repository of all the information within the system. With the advent of microprocessor technology, small independent devices became capable of performing the same data storage and manipulation as had been done previously only on large digital computers. Low cost work stations and personal computers proliferated, resulting in a vast installed base of microprocessors, minicomputers and large, general purpose computers.

Along with this decentralization of information storage and computing capabilities came immense pressure to interconnect these valuable resources, reduce costs, increase productivity and to transfer or communicate data from one computer-controlled device to another, or from one computer to another.

One known method of transferring or communicating such data is to link each pair of devices which are to communicate by a separate transmission medium of one type or another. Such a concept, while attaining the desired communication, is expensive in both the utilization of transmission media and the utilization of computing resources to control the numerous communications. For example, if four computers were to be mutually tied together using such a scheme, six separate transmission media must be used to make all the connections and each computer must monitor and control the communication activities on three communication paths. The problems of communicating using such a method are complicated further by the lack of standardization of communication protocols currently utilized by different manufacturers of computing devices.

To obtain the desired inexpensive, inter-device communication, it is necessary to provide a single transmission medium onto which devices are connected in order to communicate with other devices on the medium. For example, the Metcalfe et al, U.S. Pat. No. 4,063,220, discloses a bit-serial receiver-transmitter network continuously connected to all communicating devices. In such system a common transmission medium is tied to a plurality of interface stages each of which interconnects the transmission medium to a user device, such as a computer or a computer-controlled device (e.g. general purpose computer, special purpose computer, microprocessor, input-output station, remote terminal, or various other peripheral devices). Each interface stage constantly monitors the transmission medium looking for communications addressed to its associated user device.

In such known systems, communications frequently are in the form of bit-serial data packets with each data packet containing an address which identifies the intended recipient. Packets so addressed are received from the transmission medium by the interface stage and forwarded to the user device. To transmit data, the process is simply reversed and the user device transmits data to the interface stage, which in turn transmits the data along the transmission path after it has determined that the path is not in use. In this manner, each user device need monitor only one communication line, the line to and from the interface stage.

Each such interface stage communicates on the transmission medium using a communications protocol which is standard to all the interface stages on the network. Use of such networks, often called Local Area Networks, allows the sharing of expensive devices, provides common access to powerful computational facilities, and permits utilization of remote hardware, software and data base resources.

The capability of such known communication systems is necessarily limited by the bandwidth of the transmission medium. When the number of devices communicating on the transmission medium exhausts the bandwidth capability of the system, no additional devices can be connected to the system, nor can the existing devices increase their message rates.

The use of data packets for communication usually limits the amount of information which can be sent in any one transmission. The size of the data packet is determined by the network design and is not necessarily related to the content of the message. Thus, a message between two devices may require a plurality of data packets before the entire message is transmitted; or, on the other hand, a single data packet may contain more than one message between the two communicating devices. It is common within these networks for a message to be sent in two or more data packets and for the data packets to be sent in an order different than the order in which the information within the data packets comprise the message. Typically, interface stages do not attempt to decode messages in order to ensure message validity but utilize network-applied check words to determine data packet integrity. It is left to the user device to reconstruct and validate the message from the data packet(s).

In any data communication, and especially in data communication networks, it is common for the transmitter (often called the transmitting node) and receiver (or receiving node) to engage in a protocol which controls the communication process. For example, if the receiving node receives a message which is correct in format and passes the network check word tests then in use, the receiving node may send a message to the transmitting node acknowledging receipt of the valid data package. Likewise, if the data packet fails to conform to the required format, or to contain the correct check-words, the receiving node will typically send a non-acknowledgment message or send no acknowledgement back to the transmitting node. If the transmitting node fails to receive a valid acknowledgment, it retransmits the data packet.

Even with such protocol it frequently occurs that the transmitting node and/or receiving node erroneously sends/saves a message. For example, if the acknowledgment for a valid data packet fails to reach the transmitting node, the transmitting node will retransmit the data packet. Since the receiving node has already received a valid data packet, it may treat the retransmitted data packet as a second and independent occurrence of the data packet rather than a retransmission. Consequently, there exists a need to improve the transmission protocol so that both transmitting and receiving nodes are in correspondence as to the validity of the data packet and the need for retransmission.

In generally known data communication network systems, the transmission of protocol messages (acknowledgment, non-acknowledgment, etc.) may place a burden upon the transmission medium equal to or greater than the burden of the transmission of data packets themselves. The acknowledgment or non-acknowledgment message from the receiving node must await transmission medium availability and must compete for the use of the tranmission medium with all other waiting messages. Since acknowledgment messages are usually short in length when compared to data messages, the use of separate full-length transmissions for these protocol messages is inefficient.

Current peer networks do not generally contain a method which permits packets to be assigned priority so that high priority packets can obtain access to the medium before lower priority packets. It is therefore possible and a frequent occurrence in such systems for high priority packets to wait a considerable amount of time before transmission while numerous low priority packets are transmitted.

The interface stages in such network systems generally determine whether the medium is in use by sensing the presence of the carrier frequency at which the interface stage transmits its data packets. If no carrier signal is present, the interface stage considers the medium available and proceeds to transmit the data packet. Since it takes a finite amount of time for a data packet to travel along a transmission medium, it is possible for an interface stage to sense that the carrier is not present even though some other interface stage is transmitting on the medium. In such a situation, both interface stages will be transmitting at the same time on the same medium and hence the data packets will interfere with each other and become unintelligible. Upon the occurrence of this interference, called a collision, the interface stages must detect the collision and retransmit the message at a later time.

In systems such as disclosed in the Metcalfe et al patent, the later time can be determined by reference to a back-off timer which randomly generates a number representing a period of time in which the interface stage does not attempt to transmit on the medium. Unfortunately, since the interface stages are usually constructed identically, the back-off timers frequently generate the same back-off delay period and the recollision may occur. Moreover, back-off timers may not take into account the priority of the data packets and the lower priority packets may be given first access to the transmission medium.

The recent advances in microelectronics technology have caused a significant decrease in the cost of communicating devices. Accordingly, it is important to decrease the cost of the transmission medium which interconnect such communicating devices in a network system. Coaxial cable is frequently used as the transmission medium in such network systems. However, efforts to reduce system cost by the use of cheaper coaxial cable are often thwarted by the capacitive charateristics of low cost coaxial cable which distort data packet content and cause variations in the amplitude of a transmitted data packet's waveform.

In generally known network systems, the protocols apply between a single receiver and a single transmitter and communication may not be possible between a single transmitter and multiple receivers because the use of the protocol would involve multiple receivers simultaneously sending acknowledgment messages.

It is accordingly an object of the present invention to provide a novel method and apparatus for communicating in a multinodal data communication network using inexpensive, high-capacitance coaxial cable.

These and many other objects and advantages of the present invention will be apparent to one skilled in the art from the claims and from the following detailed description when read in conjunction with the appended drawings.

THE DRAWINGS

THE DETAILED DESCRIPTION OF THE PREFERRED EMBODIMENT

Figure 1:
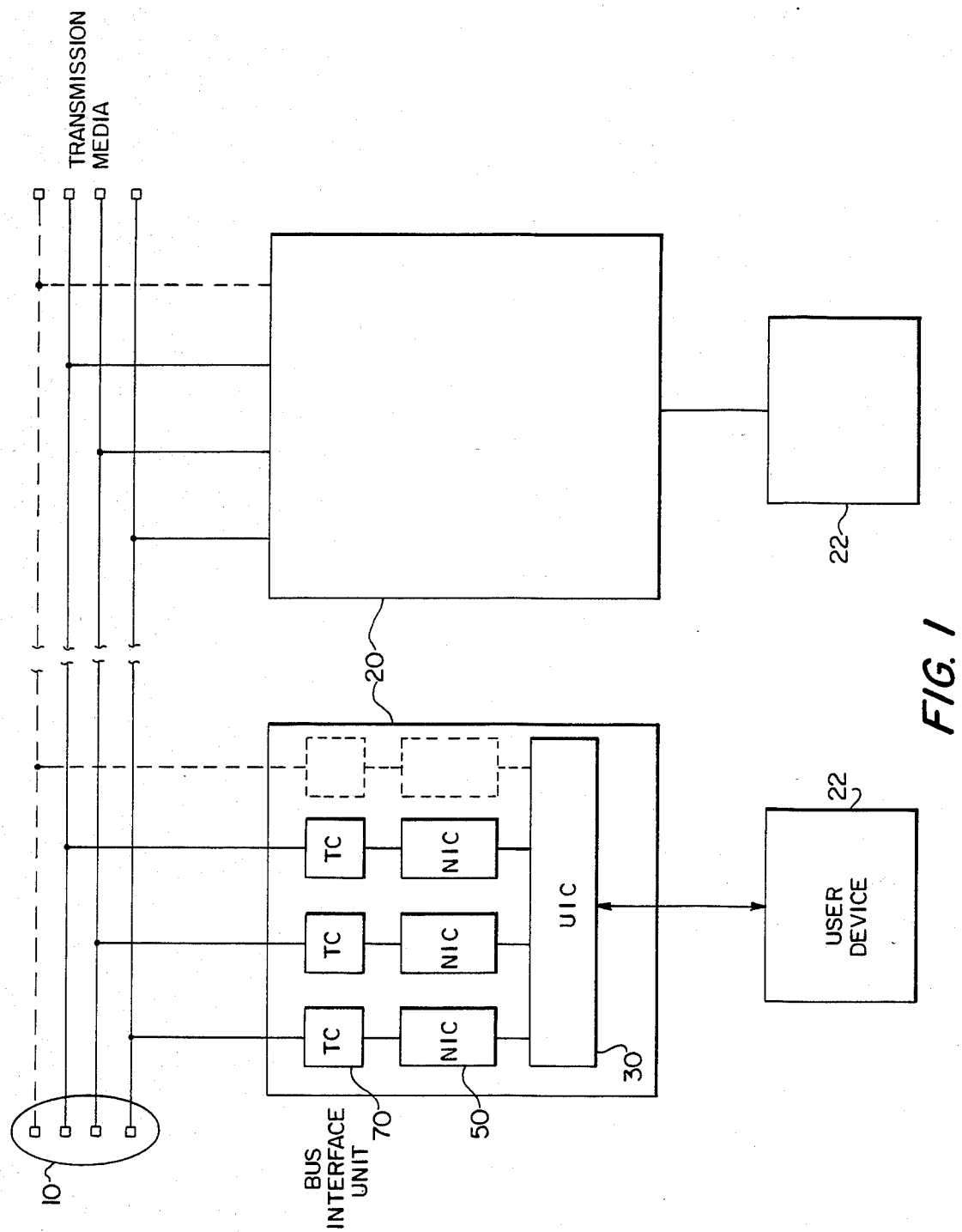
FIG. 1 is a functional block diagram of one embodiment of the system of the present invention.

One embodiment of the data communications system of the present invention is illustrated in FIG. 1 wherein a plurality of transmission media 10 are connected to a plurality of bus interface units 20. The transmission media may be any suitable electronic transmission media including such media as twisted pair wire, high speed busses, fiber optic cables, coaxial cable, or radio frequency (RF) carrier waves.

Each of the bus interface units 20 interconnects a user device 22 to the plurality of transmission media 10. The user device 22 can be any conventional computer or computer-based device, such as a work station, printer, or memory unit. Messages to be sent are generated at one of the user devices 22 and transmitted to the associated bus interface unit 20. This message may be in the form of data packets, hereinbelow described in association with FIG. 7.

The bus interface unit 20 buffers and relays the message onto one of the plurality of transmission media 10. The message propagates along one of the plurality of transmission media 10 and is available for receipt by any of the bus interface units 20 connected to the transmission medium 10 along which the message is propagating. The receiving bus interface unit 20 buffers and relays the message from the transmission medium 10 to the user device 22.

Within the bus interface unit 20, the message to be transmitted is sent first to a user interface circuit 30 which controls the communications between the bus interface unit 20 and the user device 22. The user interface circuit 30 is connected to a plurality of network interface circuits 50 which buffer messages between the user interface circuit 30 and the transmission media 10. Each network interface circuit 50 is connected through a tap circuit 70 to one of the transmission media 10. For receipt, the above described process of message sending is reversed. The tap circuit 70 receives the message and relays it to the network interface circuit 50 which stores and buffers the message until the user interface circuit 30 is available. When the user interface circuit 30 is available, it relays the message from the network interface circuit 50 to its associated user device 22.

When a message is received by the user interface circuit 30 from the user device 22, it is sent to one of the network interface circuits 50. Selection of which network interface circuit 50 is to be utilized can be based upon any conventional priority or queueing scheme. For example, the selection may be based primarily upon the amount of transmission activity present on the transmission medium to which each network interface circuit 50 is connected. The message is buffered at the network interface circuit 50, waiting until the associated transmission media 10 is available for a transmission. When the transmission media 10 is available, the message is sent from the network interface circuit 50 to the tap circuit 70, which physically places the message onto the transmission medium 10.

The use of bus interface units 20 to interconnect the plurality of transmission media 10 and the user devices 22 permits an expansion in the message handling capability of the network without placing additional control or computing requirements upon the using devices 22. In addition to increasing the available transmission bandwidth, the bus interface units 20 allow for redundancy within the transmission media 10 and for the dynamic reallocation of message traffic upon the failure or an overload of one of the transmission media 10. In addition the bus interface units 20 isolate the user device 22 from the need to monitor and control the transmission media 10. In this way, the transmission media 10 are transparent to the user device 22.

The communication process within the network system is further described below by following a message from origination to receipt at the destination user device 22.

Figure 2:
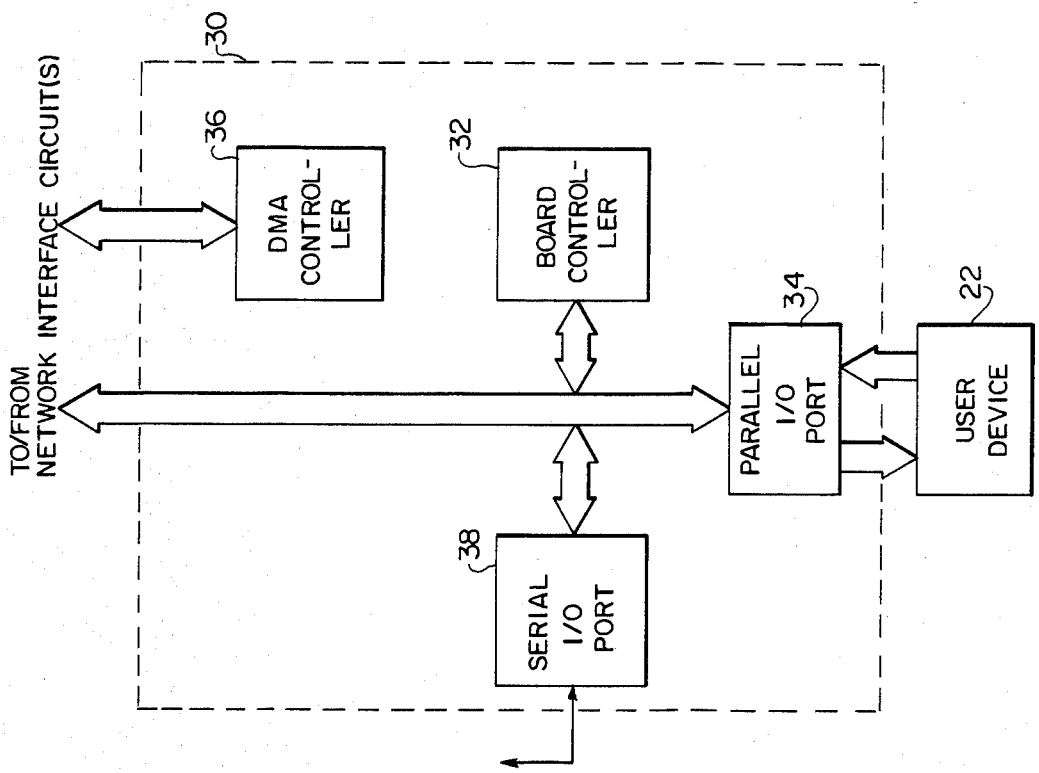
FIG. 2 is a functional block diagram of the user interface circuit component of the system illustrated in FIG. 1.

Messages between the user device 22 and its bus interface unit 20 are controlled by the user interface circuit 30 of the bus interface unit 20. One embodiment of the user interface circuit 30 is depicted in FIG. 2 wherein a microprocessor serves as a circuit controller 32. The circuit controller 32 controls the transmission of data to and from the user device 22 via a parallel input-output- (I-O) port 34. The circuit controller 32 also controls the transfer of data to and from the network interface circuit 50. For speed and efficiency of data transfer to and from the network interface circuit 50, a conventional direct memory access (DMA) controller 36 may be utilized. In addition, a conventional serial I-O port 38 may be utilized to communicate between the user interface circuit 30 and any of the conventional terminal devices such as printers or displays. In all cases, herein, in which communication from, to or within the user bus interface unit 20 is described as being parallel or serial, the description is meant to be illustrative and not limiting.

The circuit controller 32 controls data transfer to and from the user device 22. The circuit controller 32 can be programmed to communicate with the user device 22 using any of the standard point to point communication protocols. Thus, by simply changing the programming of the circuit controller 32, the user interface circuit 30 can be constructed to communicate with all varieties of user devices 22. Thus, the circuit controller 32 is the only component of the entire system which is particularized or needs to be changed to satisfy the varying requirements of communication protocol for the variety of user devices 22 accommodated by the network system.

With continued reference to FIG. 2, messages received by the user interface circuit 30 under control of the circuit controller 32, are relayed via the parallel I-O port 34 to the network interface circuit 50 selected by the circuit controller 32. The circuit controller 32 can be programmed to allocate messages to the various network interface circuits 50 in accordance with any particular communications strategy. For example, the circuit controller 32 can attempt to level the load applied to each network interface circuit 50, or to send particular types of messages to particular network interface circuits 50, or to send certain priority messages to certain network interface circuit 50. Once the circuit controller 32 has decided to send the message to one of the network interface circuits 50, the circuit controller 32 instructs the DMA controller 36 to actually accomplish the data transfer and to load the data into the memory of the network interface circuit 50.

The serial I-O port 38 can be configured in any of the standard serial interfaces to allow communication with a wide range of standard peripheral devices including consoles, keyboards, printers and displays. The circuit controller 32 may thereby communicate with such peripheral devices to provide insight into the operating performance and characteristics of the network, or to permit maintenance diagnostic programs to be loaded and executed.

Figure 3:
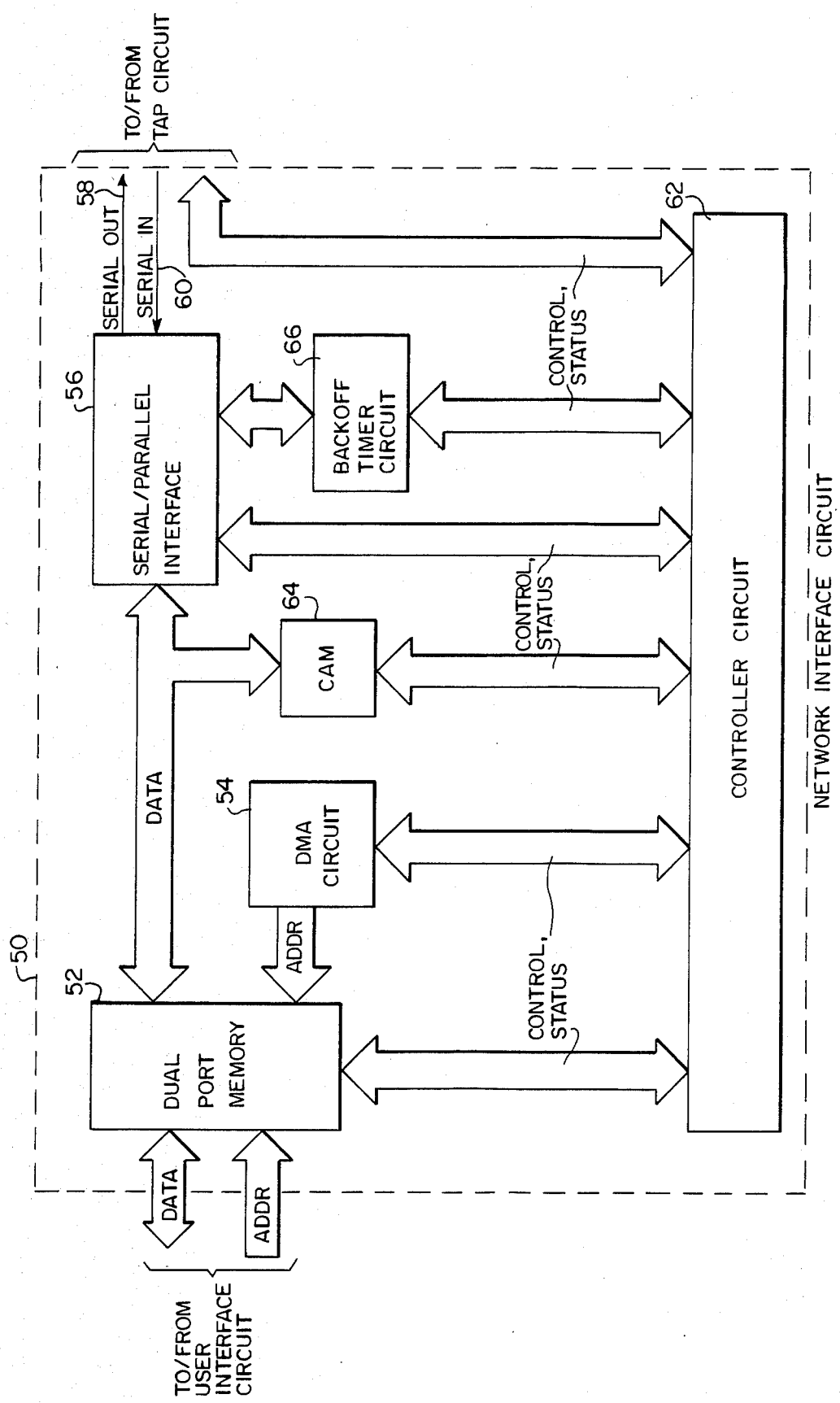
FIG. 3 is a functional block diagram of the network interface circuit component of the system illustrated in FIG. 1.

The network interface circuit 50, further illustrated in FIG. 3, provides temporary storage for data packets between the user device 22 and the actual transmission media 10. The network interface circuit 50 also does parallel/serial, serial/parallel conversions, and generates and checks the network transmission check words used to verify transmission integrity. Data packets arriving from the user interface circuit 30 may be stored in a dual port memory 52. The dual port memory 52 is connected to a serial/parallel interface unit 56 which in turn is connected to the tap circuit 70 via serial lines 58 and 60. All of the devices on the network board are controlled by a controller circuit 62.

Messages received from the user interface circuit 30 are stored in the dual port memory 52 until the associated transmission medium 10 is available for a transmission. When the transmission medium 10 becomes available, the data packet is taken from the dual port memory 52 under the control of a DMA controller 54 and sent through the serial/parallel interface unit 56 and one of the serial lines 58, 60 to the tap circuit 70. The serial/parallel interface unit 56 may compute a check word or check words to enable the system to perform error detection after transmission. The remaining components of the network interface circuit 50 are utilized when data are received from the tap circuit 70 as will be further described hereinafter.

Figure 4:
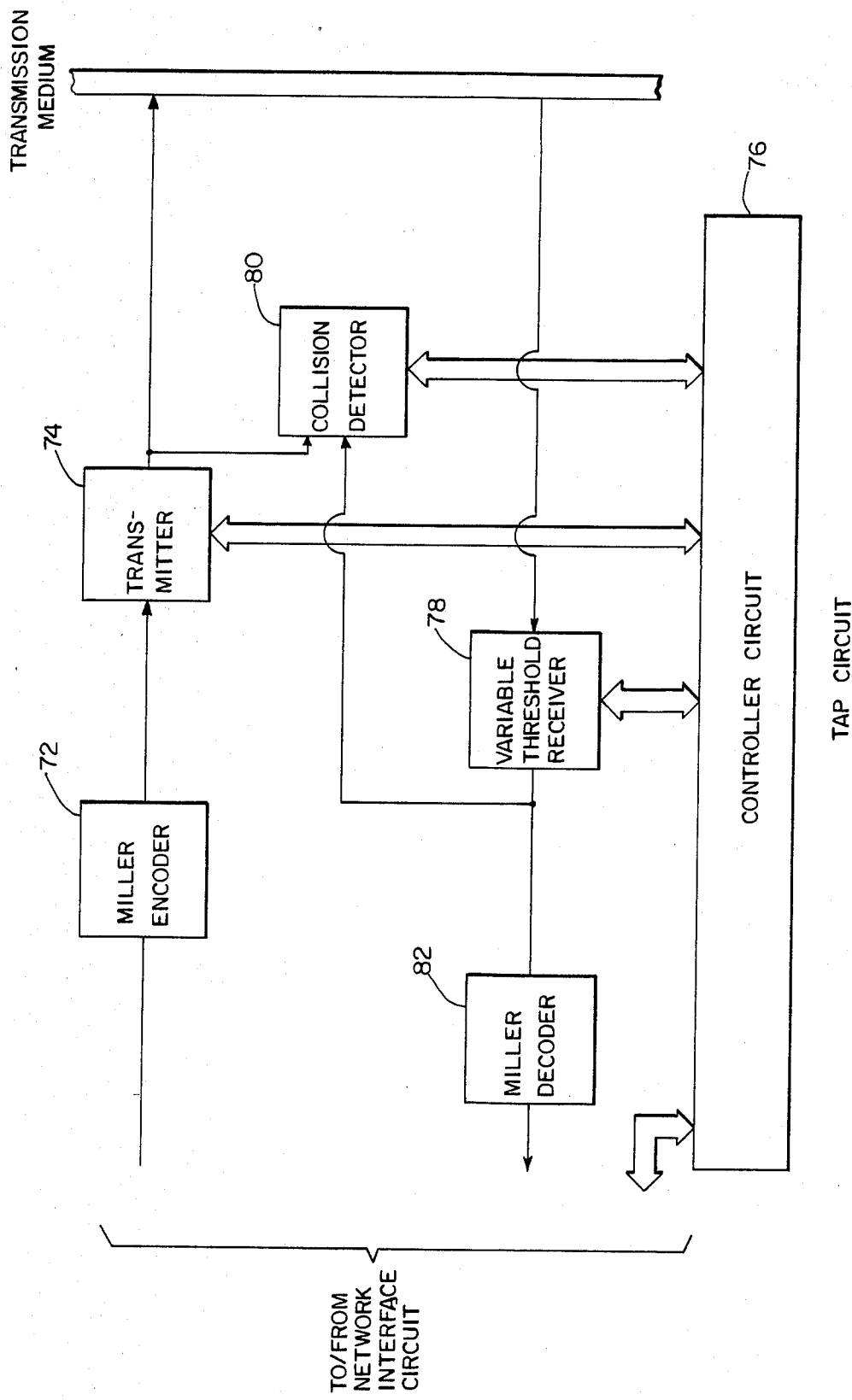
FIG. 4 is a functional block diagram of the tap circuit component of the system illustrated in FIG. 1.

The tap circuit 70, illustrated in FIG. 4, is an active device which provides the physical and electrical interface between the network interface circuit 50 and the transmission media 10. Serial binary data received from the network interface circuit 50 may be delay modulated by a Miller encoder 72 to provide bandwidth compression, synchronization information, and a DC-free spectrum. After the data has been encoded, it is sent to a transmitter 74 which physically places the data upon the transmission medium 10. All of the devices on the tap circuit 70 are under the control of a controller circuit 76.

Data packets placed upon the transmission medium 10 by the transmitter 74 are propagated along the transmission medium 10 to the other bus interface units 20 in the network connected to the same transmission medium 10. At each bus interface unit 20, the data packets are detected and received by a variable threshold receiver 78 operative to recognize and accept data packets from the transmission medium 10 which have been sent in accordance with the protocol of the network.

Each tap circuit 70 may be provided with a collision detector 80 which compares the data transmitted by the transmitter 74 to that received by the variable threshold receiver 78. If the data received does not match the data transmitted a collision has been detected and the controller circuit 76 is so notified by the collision detector 80. Upon notification of a detected collision, the controller circuit 76 commands the transmitter 74 to transmit a suitable jamming signal to ensure that all other transmitting bus interface units 20 also detect the collision. Data received by the variable threshold receiver 78 is sent to the network interface circuit 50 via a Miller decoder 82 which decodes the delay modulated data back into a serial binary format.

As shown in FIG. 3, data received by the tap circuit 70 is sent to the network interface circuit 50 via one of the serial lines 58, 60 to the serial/parallel interface unit 56. The parallel data exiting the serial/parallel interface unit 56 is examined by a content addressed memory (CAM) 64 which performs a high-speed search through the data based on content rather than specified addresses. In particular, the CAM 64 examines the data packet to determine whether the packet is addressed to the user device 22 associated with the particular bus interface unit 20. Data packets not addressed to the user device 22 are ignored and those which have the proper address continue down the network interface circuit 50 into the dual port memory 52 for temporary storage.

With reference to FIG. 1, the data received by the network interface circuit 50 from the tap circuit 70 is transmitted to the user interface circuit 30 in a process which is the reverse of that used to send data, as described above. As shown in FIG. 2, when the circuit controller 32 ascertains that the user device 22 is prepared to accept the data, the circuit controller 32 instructs the DMA controller 36 to obtain the data from the network interface device 50 and to transmit it via the parallel I-O port 34 to the user device 22.

As shown in FIG. 1, the user interface circuit 30 is full duplex and can interleave data going to and coming from the transmission media 10. When the user interface circuit 30 detects that a valid packet has been received by the network interface circuit 50 from the transmission media 10, the user interface circuit 30 signals the user device 22 of the awaiting message. When the user device 22 is ready, the user interface circuit 30 transfers the packet and thereby frees the network interface circuit 50 for reuse.

The use of a plurality of transmission media 10 increases the capacity of the system to transmit messages with a minimum of additional hardware and with no additional burden imposed upon the user device 22. Heretofore, each node of a multinodal data communication network was linked by a single transmission medium. If the message capacity of the transmission medium was reached, additional message traffic required a second, independent network with its own transmission medium and a corresponding increase in the communications burden imposed on each user device on the original and second networks. The novel use of the user interface circuit 30 obviates these problems as the user device 22 communicates solely with the user interface circuit 30 and is independent of the transmission media 10.

Transmissions between bus interface units 20 within the network are conducted on two levels: physical (or electrical) and logical. The tap circuits 70 control the physical interface between the bus interface units 20 and the transmission media 10. The network interface circuits 50 control the logical structure of the messages and implement the protocol used in the network for communicating the messages.

One of the protocols implemented on the network may be a protocol which assigns priorities to data packets to be transmitted and which transmits the data packets in accordance with the assigned priority. In the network system of the preferred embodiment, such a priority scheme may be implemented first by assigning a priority to data packets in accordance with any conventional priority assignment scheme. Once a priority has been assigned, the data packet is queued for transmission, awaiting availability of the transmission medium. Such a system is depicted in FIG. 5.

Figure 5:
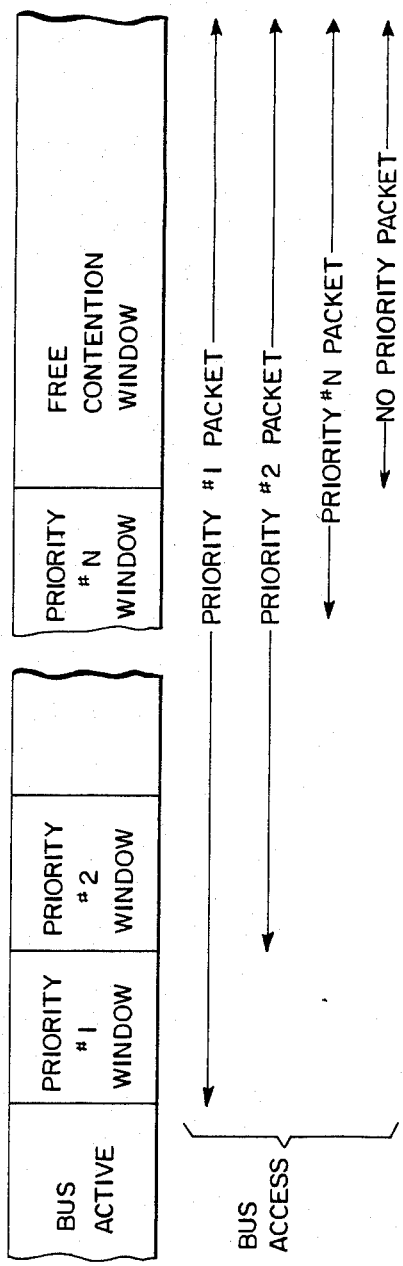
FIG. 5 is a timing diagram illustrating a method of implementing a data packet priority scheme in the system illustrated in FIG. 1.

With reference to FIG. 5, time slots, in the form of priority windows, are created by all network interface circuits 50 which have data packets awaiting transmission after the medium becomes inactive (i.e., available). Thereafter, high priority data packets are transmitted during the first time slot and successive priorities will use successive time slots. If the transmission medium is inactive when the time slot corresponding to a particular priority data packet occurs, the network interface circuit 50 containing that particular priority data packet seizes the medium by starting to transmit via the tap circuit 70. Upon the completion of a data packet transmission, the priority sequence is repeated by all network interface circuits 50 still having a data packet awaiting transmission. With this priority scheme, higher priority data packets do not have to contend with lower priority data packets for access to the transmission medium and higher priority data packets are given access to the transmission medium before lower priority data packets.

Even with the priority scheme described above, it is possible for data packets to collide on the transmission medium. In known systems, data packets which have collided may be held for a random delay time after a collision in order to avoid a recollision. However, since these systems usually utilize identical random number generators to set the random delay time, it is a frequent occurrence that both colliding data packets will be held for an identical random delay, thereby causing a recollision. Moreover, such conventional schemes do not account for the relative priority of the colliding data packets in re-accessing the transmission medium. In the network system of the preferred embodiment, a further protocol may be utilized to resolve collisions in accordance with the priority of the colliding data packets.

Figure 6:
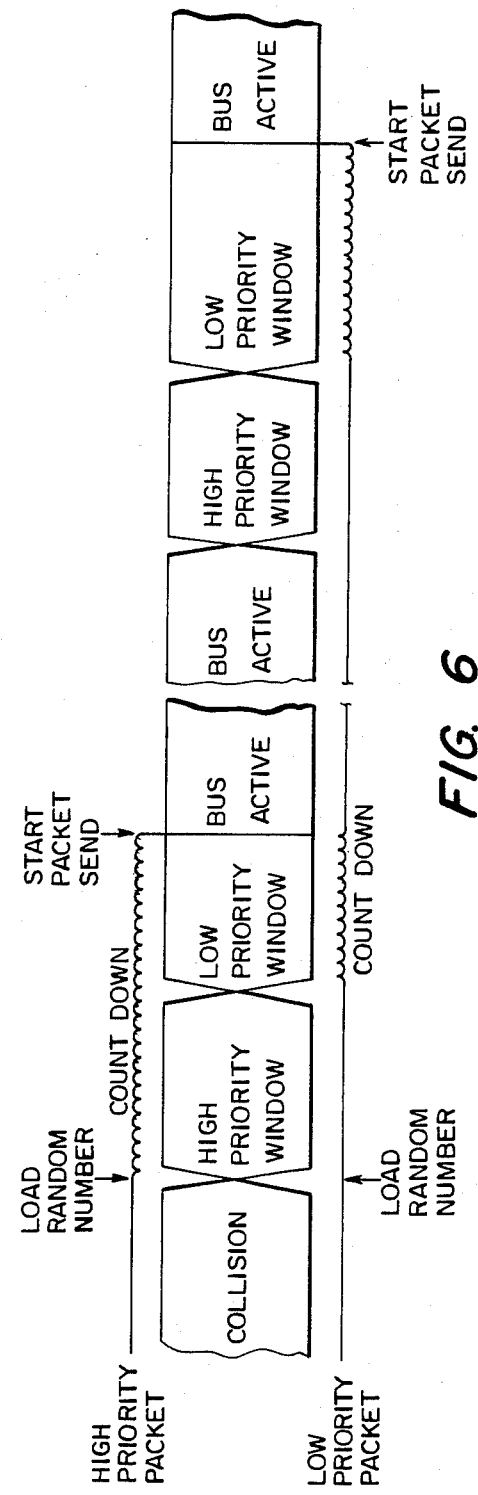
FIG. 6 is a timing diagram showing a method of implementing a post-collision data packet priority scheme in the system illustrated in FIG. 1.

In the network system of the preferred embodiment, a protocol may be utilized which favors the higher priority data packet in reaccessing the transmission medium. In one such scheme, illustrated in FIG. 6, upon the collision of two or more data packets the associated network interface circuits 50 utilize a pseudorandom delay variable, as a delay count. While the transmission medium is busy, neither network interface circuit 50 decrements the delay count, contained in a backoff-timer circuit 66. When the transmission medium becomes inactive and the priority windows constructed as described above, the network interface circuits 50 begin to decrement their delay count when the appropriate priority window occurs. When the delay count at one of the network interface circuits 50 reaches zero, that network interface circuit 50 re-transmits the data packet. The lower priority packet will not start decrementing the delay count until the corresponding lower priority window is created.

With the above-decribed protocol, higher priority data packets are given an advantage in ending the delay time first. Moreover, collisions of equal priority data packets are resolved by the pseudo-random delay count.

In multinodal data communication networks, the receipt of valid (i.e., no error) data packets and the knowledge of valid data packet transmission is valuable for an efficient and reliable system. However, some previous network systems do not provide a verification response on receiving a data packet. This provides the transmitting node with no feedback on the data packet status and a poor basis for fault detection. Some other network systems require the receiving node to send a complete data packet to the transmitting node describing the status of the previously-received packet. This method gives the desired information but, due to packet size, data transfer may be hampered by the volume of the traffic on the medium. Furthermore, the status packet contends for access of the medium, which only increases the packet acknowledgement latency and complicates data structure within the user device.

To reduce the burden of sending status information on the transmission medium and to increase the assuredness with which data packets are transmitted, the system of the preferred embodiment may be implemented wherein the receiving node transmits a special status packet of shortened length. Under such a system, the transmitting node constructs a time-out window within which the receiving node has the opportunity to respond with status information. No other network interface circuit 50 will contend for the transmission medium until the acknowledgement window has expired. If no acknowledgement is received by the transmitting node within the time-out window, or if an error acknowledgement is received, the transmitting node sends an "abort" message to the receiving node. This "abort" messages notifies the receiving node to abort the previous message and prepare for a retransmission.

Upon receiving a data packet, a receiving node verifies the format and checkwords of the data packet and verifies that it has a buffer available in which to accept the message. Should an error occur or should no buffer be available, the receiving node transmits a status packet of shortened length which notifies the transmitting node of the occurrence of an error and the need to resend the message. If the message is valid, the receiving node sends a valid acknowledgement message and creates another time-out window (delay) for a possible abort command. If the time-out window for the abort command expires without receipt of an abort command, the last received data packet is considered valid and the packet information is passed further into the bus interface unit 20. If the abort command is received, the buffers are released of data and are cleared.

The entire acknowledgement process validates the integrity of data packets being transmitted, increases the assuredness of packet transmission, and is independent of and invisible to the user device 22.

Figure 7:
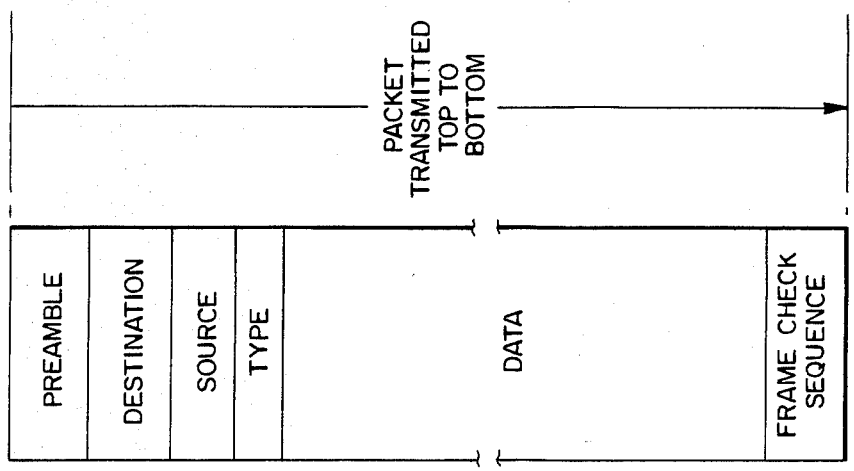
FIG. 7 is an illustration of the format of a typical data packet of a type generally transmitted in systems similar to that illustrated in FIG. 1.

Typically, data packets consist of several sections as illustrated in FIG. 7: preamble, destination address, source address, packet type, data or information, and a frame check sequence. The preamble section usually consists of an established bit pattern which contains no information and is utilized to synchronize and align the communications equipment. The destination address identifies the user device or devices 22 to which the data packet is destined. The source address identifies the user device 22 which has generated and whose associated bus interface unit 20 is transmitting the message. The type section indicates the type of data packet which is being transmitted (e.g., status packet, acknowledgement packet, data packet, etc.). The data section contains the message, several messages, or parts of one message which are being sent from one user device 22 to another. The frame check sequence consists of the checkwords calculated and generated by the network interface circuit 50 in any conventional manner to ensure the integrity of the transmission sequence.

In the preferred embodiment of the present system, the addressing scheme for destinations and the transmission protocol may be designed to permit the transmission of a single message from a single source to multiple destinations. In such a design system, a certain address or addresses may be reserved for all call or group call messages. When a transmitting node wants to send a message to all other nodes or to specific groups of nodes, the transmitting node may address these multiple nodes by one of these reserved destination addresses. The protocol utilized by the receiving nodes under these circumstances can be modified so that, upon receipt of multiple destination messages, the receiving nodes do not provide any acknowledgement, since such acknowledgement from receiving nodes may unduly burden the transmission medium.

In providing an inexpensive method of communicating among peers in a computer network system, it is advantageous to utilize the most inexpensive transmission medium feasible. Twisted pair wire is the least expensive means of data transmission but due to its connectivity and noise immunity limitations, twisted pair is generally used in very low speed, low duty cycle devices. Flat cable is a form of twisted pair which has better means of connection, but its high speed performance value is not much better than twisted pair. Optical fiber transmission is a relatively new means of transmission media. Optical fiber media provide excellent immunity to electro-magnetic interference and noise while providing excellent bandwidth. However, the supporting circuitry is extremely expensive and often difficult to obtain. Radio transmission is another means of data communications. Some spectral bands have good noise immunity compared with electrical media, however, radio wave multipath can cause new problems of distortion and fading.

Coaxial cable is a common media of data transmission. It exhibits good noise immunity, but like twisted pair, the coaxial cable has inherent line capacitance and attenuation which distorts the signal over long cable lengths. Low capacitance/low loss coaxial cables alleviate this problem but cost and availability make them impractical in many applications.

Due to the attenuation characteristics and high capacitance of low cost coaxial cable, the greater the distance between the nodes, the weaker and more distorted the signal becomes. The nature of the data packets will also cause the cable to respond as a periodically-excited circuit with a charging time constant and a steady-state direct current off-set voltage being related to the cable capacitance. Previous systems have compensated for these problems in various ways. One way is by adding several bits preceeding the data messages. These bits are shown as the preamble in FIG. 7. The preamble allows time for the cable to settle to a usable value for a receiver before actual data is transmitted. Another method of compensating for inherent cable characteristics in inexpensive coaxial cable is to adjust the hardware or software to compensate for those characteristics. In the system of the present embodiment, a variable threshold receiver may be utilized.

An efficient way to solve this problem is to create a variable threshold receiver which reacts fast enough to recover the first bit regardless of line capacitance. This shortens and simplifies data packets on the coaxial cable and allows more data throughput. In addition, this method adjusts the received threshold in accordance with other variables which may affect the signal (i.e., weak transmitter, bad cable, etc.).

Figure 8:
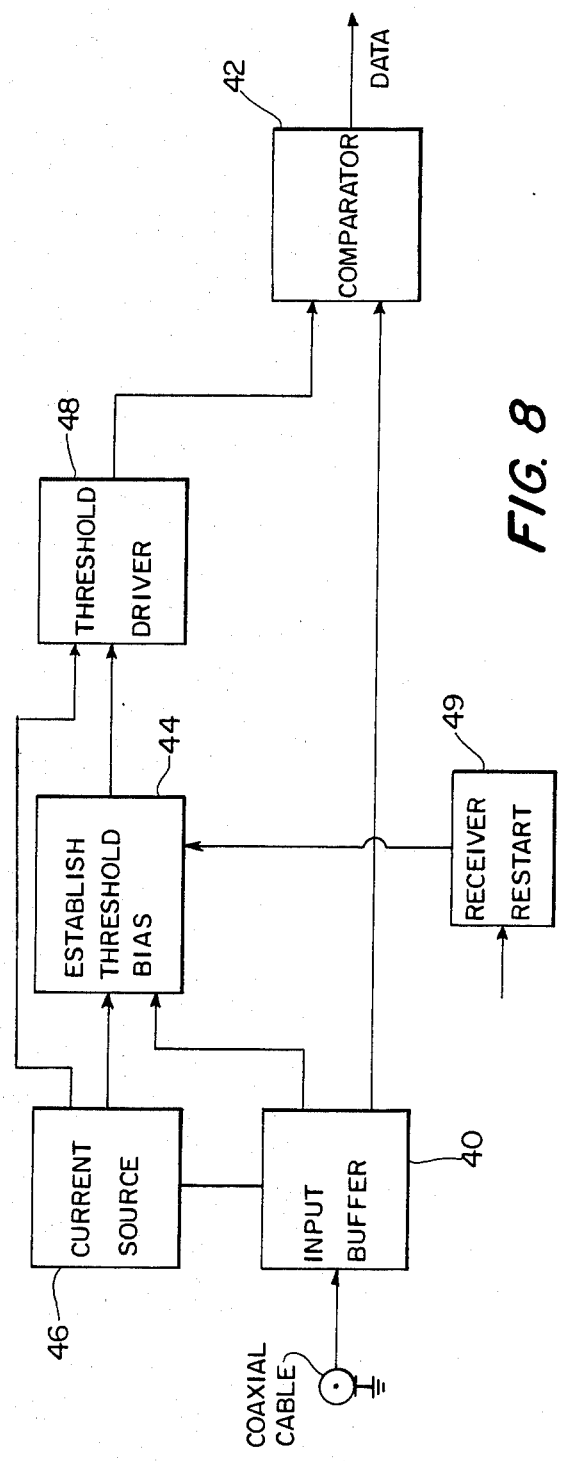
FIG. 8 is a functional block diagram of a variable threshold receiver component of the tap circuit illustrated in FIG. 4.

With reference to FIG. 8, a variable threshold receiver of the preferred embodiment provides signal recovery by tracking the average of the peak signal levels present on the coaxial cable. Data are received from the coaxial cable at an input buffer 40. The input buffer 40 may be characterized as providing a high impedance input with negligible loading on the coaxial cable.

The received data is buffered to a comparator 42 and to a circuit 44 to establish the threshold bias. The threshold is established by the charging/discharging capabilities of a capacitor or the like and the value of this capacitor is related to the bandwidth of the data packets. Both the input buffer 40 and the circuit 44 to establish threshold bias are provided with a constant current source 46. The threshold bias value is provided to the comparator 42 through a threshold driver circuit 48. The output signal from the comparator 42 is the recovered data. A receiver restart circuit 49 is provided to utilize the threshold at the beginning of the receipt of a data packet.

Figure 9:
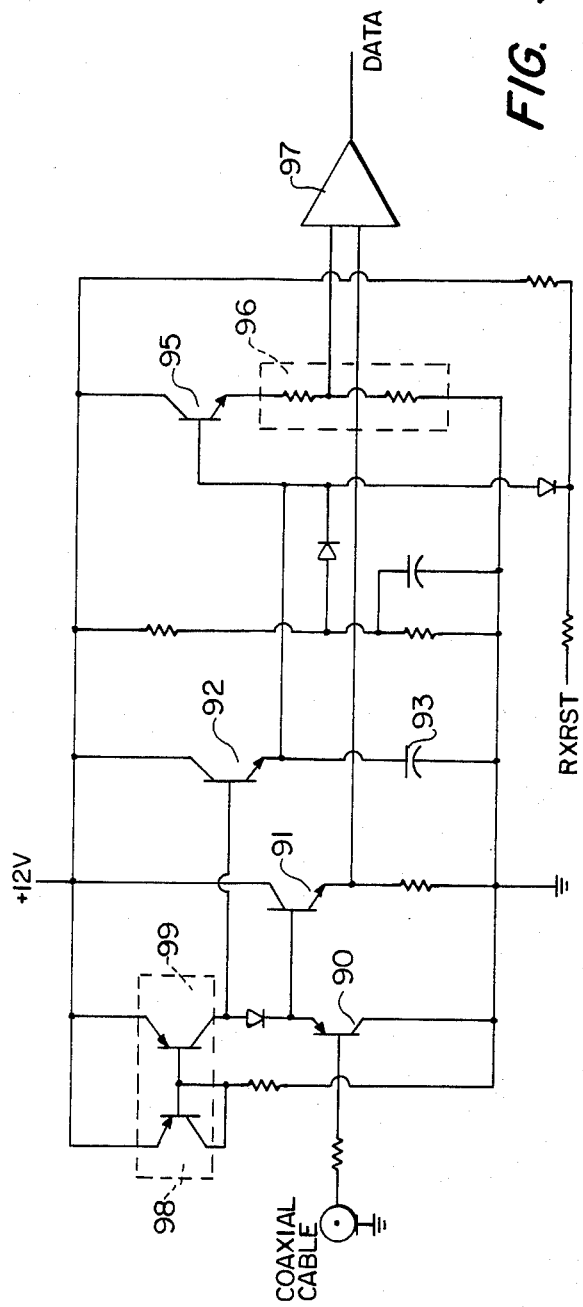
FIG. 9 is a circuit diagram of one embodiment of the variable threshold receiver illustrated in FIG. 8.

An embodiment of a variable threshold receiver of the present invention is illustrated in the circuit diagram of FIG. 9. In that circuit, the data packets are passed from the coaxial cable to an input transistor 90. The data from the input transistor 90 is applied to a inverter transistor 91 and subsequently to a threshold transistor 92. The threshold transistor 92 charges a threshold capacitor 93 whose charge/discharge characteristics are related to the bandwidth of the data packet. The threshold transistor 92 and threshold capacitor 93 establish a threshold bias voltage which drives a divider transistor 95. The emitter of the divider transistor 95 drives a voltage divider 96 whose output voltage is applied to one of the input terminals of an integrator/comparator 97. The other input terminal of the integrator/comparator 97 is connected to the emitter of the inverter transistor 91. Mirror transistors 98, 99 provide a constant current source for the input transistor 90, the inverter transistor 91, the threshold transistor 92 and the divider transistor 95. A receiver reset signal is externally generated at the end of a data packet and clears the charge on the threshold capacitor 93 after each transmission, allowing the receiver to adjust threshold values for different data packets.

When data packets are received by the variable threshold receiver, illustrated in FIG. 9, the data is buffered into the receiver by input transistor 90. This transistor may be a PNP type to provide a high impedance input from the coaxial cable for a minimum load upon the cable. The inverter transistor 91 inverts the data signal back to its original reference. This restored signal is applied to the integrator/comparator 97. The data buffered from the input transistor 90 also drives the threshold transistor 92. A threshold transistor 92 charges the threshold capacitor 93. The charge/discharge characteristics of the threshold capacitor 93 are related to the bandwidth of the data packet. The threshold bias is established by the threshold transistor 92 and threshold capacitor 93. This threshold bias is provided to a voltage divider 96 to establish the desired threshold for the integrator/comparator 97. The integrator/comparator 97 compares the created threshold bias value from the voltage divider 96 to the buffered input signal from the inverter transistor 91. The output terminals of the integrator/comparator 97 contain the recovered data.

In the foregoing description, functions, methods and apparatus have been described in association with a particular, named circuit such as the tap circuit 70, network interface circuit 50 or user interface circuit 30. This description of an association is by way of illustration and is not intended to be limiting.

These and many other advantages of the present invention will be readily apparent to one skilled in the art from the claims. It should be understood that the foregoing description of the perffered embodiment is illustrative only, and that many modifications may be made without departing from the spirit thereof as defined in the claims when accorded a full range of equivalents.

What is claimed is:

1. Apparatus for decoding a composite signal having a varying d.c. offset voltage comprising:
   (a) an input transistor adapted to receive an input composite signal comprising discrete unipolar signals in varying sequence and amplitude and providing an output signal representative of said input signal at its emitter electrode;
   (b) a threshold transistor having it base electrode electrically connected to the emitter electrode's said input transistor;
   (c) a bias capacitor electrically connected between the emitter electrode of said threshold transistor and ground reference, the charging/discharging characteristics of said capacitor being related to the bandwidth of the composite signals so that the signal appearing at the emitter electrode of said threshold transistor is representative of the average peak amplitude levels in the composite signal;

(d) a threshold bias transistor having its base electrically connected to the emitter of said threshold transistor;
(e) a voltage divider network comprising a plurality of series-connected resistors, serially connected between the emitter electrode of said threshold bias transistor and ground; and
(f) an integrator/cosmparator having two input terminals, one of said input terminals being electrically connected to the output signals of said input transistor and the other of said input terminals being electrically connected to a point between two of said plurality of resistors in said voltage divider network;

whereby a decoded output signal is derived from said integrator/comparator by comparing the output signal obtained from said voltage divider with the signal obtained from the output of said input transistor.

2. The apparatus of claim 1 wherein said threshold bias transistor is responsive to an input signal to initiate a new signal average upon the new composite digital data signal.

3. A method for generating a variable level threshold signal which averages the peak amplitude levels of the individual information signals in a composite signal having different, unipolar amplitude levels, comprising the steps of:
(a) receiving the individual information signals;
(b) determining the voltage level of the received individual information signals;
(c) averaging within the duration of a bit time of an individual information signal the determined voltage level over a predetermined time period related to the bandwidth of the composite signal; and
(d) producing a threshold level signal equal in amplitude to the averaged determined voltage level.

4. Apparatus for generating a variable level threshold signal which averages the peak amplitude levels of the individual data signals in a composite signal having different, unipolar amplitude levels, comprising:
(a) buffering means responsive to the application of a composite digital data signal to provide a high impedance to the transmission medium of the composite digital data signal;
(b) means operatively connected to said buffering means for determining the voltage level of the individual digital data signals within the composite digital data signal;
(c) means responsive of said determining means for averaging within the duration of a bit time of an individual information signal the determined voltage levels over a time period related to the bandwidth of the composite digital data signal; and
(d) means responsive to said averaging means for producing a threshold bias level signal equal in amplitude to the averaged voltage level.

5. The apparatus of claim 4 wherein said averaging means is responsive to an input signal to initiate a new average upon the receipt of a new composite digital data signal.

* * * * *